(12) United States Patent
Hatakenaka

(10) Patent No.: US 11,569,379 B2
(45) Date of Patent: Jan. 31, 2023

(54) SEMICONDUCTOR DEVICE AND SEMICONDUCTOR DEVICE MANUFACTURING METHOD

(71) Applicant: ABLIC Inc., Tokyo (JP)

(72) Inventor: Masahiro Hatakenaka, Tokyo (JP)

(73) Assignee: ABLIC Inc., Tokyo (JP)

( * ) Notice: Subject to any disclaimer, the term of this patent is extended or adjusted under 35 U.S.C. 154(b) by 60 days.

(21) Appl. No.: 17/209,200

(22) Filed: Mar. 22, 2021

(65) Prior Publication Data

US 2021/0305425 A1    Sep. 30, 2021

(30) Foreign Application Priority Data

Mar. 31, 2020    (JP) .............................. JP2020-061816

(51) Int. Cl.

| | | |
|---|---|---|
| *H01L 29/78* | (2006.01) | |
| *H01L 29/66* | (2006.01) | |
| *H01L 21/265* | (2006.01) | |
| *H01L 21/225* | (2006.01) | |

(52) U.S. Cl.
CPC ...... *H01L 29/7833* (2013.01); *H01L 21/2253* (2013.01); *H01L 21/26513* (2013.01); *H01L 29/66492* (2013.01)

(58) Field of Classification Search
CPC ............. H01L 29/7833; H01L 21/2253; H01L 21/26513; H01L 29/66492; H01L 29/0847; H01L 29/42368; H01L 29/1045; H01L 29/66659; H01L 29/7836; H01L 29/7835; H01L 27/0266; H01L 27/0296; H01L 29/0607; H01L 29/0684; H01L 29/36

See application file for complete search history.

(56) References Cited

U.S. PATENT DOCUMENTS

| | | | | |
|---|---|---|---|---|
| 5,907,173 A | * | 5/1999 | Kwon ................... | H01L 29/402 257/341 |
| 2010/0032753 A1 | * | 2/2010 | Alter ................. | H01L 29/66575 257/E29.256 |
| 2017/0287898 A1 | * | 10/2017 | Morita ............ | H01L 21/823807 |

FOREIGN PATENT DOCUMENTS

JP          2007266473          10/2007

* cited by examiner

*Primary Examiner* — Syed I Gheyas
(74) *Attorney, Agent, or Firm* — JCIPRNET

(57) ABSTRACT

In the semiconductor device, a high-concentration diffusion layer and a low-concentration diffusion layer are disposed around a drain diffusion layer of an ESD protection element. The high-concentration diffusion layer is separated from a gate electrode, and a medium concentration LDD diffusion layer is disposed in a separation gap. Variations in characteristics are suppressed by reducing thermal treatment on the high-concentration diffusion layer and a medium concentration diffusion layer.

9 Claims, 14 Drawing Sheets

SEMICONDUCTOR DEVICE AND SEMICONDUCTOR DEVICE MANUFACTURING METHOD

CROSS-REFERENCE TO RELATED APPLICATION

The application is based on Japanese Patent Application No. 2020-061816 filed on Mar. 31, 2020, the content of which is incorporated herein by reference.

BACKGROUND

Technical Field

The present disclosure relates to a semiconductor device, and more particularly to a structure of a semiconductor device having an enhanced breakdown voltage and a method for manufacturing the semiconductor device.

Description of Related Art

A semiconductor integrated circuit is provided with an electrostatic discharge (ESD) protection element in order to protect an internal element from noise caused by various surges represented by ESD and fluctuations in a power supply voltage. In particular, the operating range of an ESD protection element, such as an off-transistor disposed in a condition that a gate is normally off, needs to be set higher than the maximum operating voltage of a semiconductor integrated circuit and lower than the breakdown voltage of an internal element used inside the semiconductor integrated circuit. However, the operating range required for an ESD protection element is narrowed due to miniaturization, and it is difficult to realize desired characteristics.

On the other hand, as a function of a protection element, it is also necessary to have high ESD resistance, that is, to have low resistance to avoid destruction caused by a flow of a large amount of current.

As an improvement measure, a double diffusion layer is disposed around a drain region including a drain diffusion layer in order to lower the concentration of impurities in the vicinity of a P/N junction on a drain side for determining a breakdown voltage of a transistor and increase the concentration of impurities in the vicinity of a drain diffusion layer having a high impurity concentration, thereby improving breakdown voltage and setting low on-resistance (see, for example, Patent Document 1: Japanese Patent Laid-Open No. 2007-266473).

In general, since arrangement of a high-concentration diffusion layer near a gate electrode increases an electric field and reduces a breakdown voltage, it is necessary to dispose the high-concentration diffusion layer away from the gate electrode in order to enhance the breakdown voltage. In addition, a protection element enters a bipolar operation by applying an overvoltage, and thermal destruction is likely to occur due to the concentration of the electric field at the boundary of the drain diffusion layer. In order to suppress this phenomenon, a region in the middle from the gate electrode to the drain diffusion layer should be formed to have a high concentration.

That is, in order to secure a drain breakdown voltage and suppress deterioration of the protection element, it is necessary to separate the high-concentration drain diffusion layer from the gate electrode and increase the concentration of the entire region in the middle as much as possible.

On the other hand, in order to secure a breakdown voltage, in a transistor having a multiple diffusion structure, the structure of diffusion layers needs to be adjusted to fall within the range of a desired breakdown voltage so that the concentration gradient of the region extending to the drain diffusion layer becomes gentle in a drain region. It has been difficult, however, to manufacture an element capable of protecting an internal element with a margin because a breakdown voltage fluctuates with changes in a structure and process.

The present invention thus aims to provide a semiconductor device that suppresses deterioration of an ESD protection element, easily realizes a desired breakdown voltage, and has sufficient ESD resistance.

SUMMARY

According to an embodiment of the present invention, a semiconductor device is configured as follows.

The semiconductor device includes a semiconductor substrate, a second conductivity-type low concentration diffusion layer provided on the semiconductor substrate, a gate electrode provided on a surface of the second conductivity-type low concentration diffusion layer with an interposition of a gate oxide film, a first conductivity-type source diffusion layer provided on a surface of the semiconductor substrate which is positioned on one side of the gate electrode, and a first conductivity-type drain diffusion layer provided on the surface of the semiconductor substrate which is positioned on the other side of the gate electrode to be separated from the gate electrode, a first conductivity-type drain LDD diffusion layer provided on the surface of the semiconductor substrate between the drain diffusion layer and a portion directly under an end of the gate electrode on the drain diffusion layer side, a first conductivity-type high concentration diffusion layer provided to include the drain diffusion layer from a position closer to the drain diffusion layer than an end of the drain LDD diffusion layer on the source diffusion layer side and having a concentration of impurities higher than that of the drain LDD diffusion layer and lower than that of the drain diffusion layer, and a first conductivity-type low concentration diffusion layer provided to include the drain LDD diffusion layer, the high-concentration diffusion layer, and the drain diffusion layer from the surface of the semiconductor substrate below the gate electrode and having a concentration of impurities lower than that of the drain LDD diffusion layer.

According to another embodiment of the present invention, a semiconductor device is configured as follows.

The semiconductor device includes a semiconductor substrate, a second conductivity-type low concentration diffusion layer provided inwardly from a surface of the semiconductor substrate, a first conductivity-type source diffusion layer and a first conductivity-type drain diffusion layer provided on the surface of the semiconductor substrate on an inner side of the second conductivity-type low concentration diffusion layer with an interval, a field oxide film provided from a position between the source diffusion layer and the drain diffusion layer to an end of the drain diffusion layer, a gate oxide film provided from an end of the field oxide film on the source side to an end of the source diffusion layer on a surface of the second conductivity-type low concentration diffusion layer, a gate electrode provided to cover portions of the gate oxide film and the field oxide film, a first conductivity-type drain LDD diffusion layer provided on the surface of the semiconductor substrate below the field oxide film, a first conductivity-type high concentration diffusion layer provided to include the drain diffusion layer from a position closer to the drain diffusion layer than an end of the drain LDD diffusion layer on the source diffusion layer side and having a concentration of impurities higher than that of the drain LDD diffusion layer and lower than that of the drain diffusion layer, and a first conductivity-type low concentration diffusion layer provided to include the drain LDD diffusion layer, the high-concentration diffusion layer, and the drain diffusion layer therein from the surface of the semiconductor substrate below the gate electrode and having a concentration of impurities lower than that of the drain LDD diffusion layer.

According to still another embodiment of the present invention, a semiconductor device manufacturing method is configured as follows.

The semiconductor device manufacturing method includes ion-implanting second conductivity-type impurities on a semiconductor substrate, ion-implanting first conductivity-type impurities to form a low-concentration diffusion layer by thermal diffusion, ion-implanting first conductivity-type impurities to form a high-concentration diffusion layer, forming a gate oxide film, forming a gate electrode, ion-implanting first conductivity-type impurities to form a source diffusion layer and a drain diffusion layer, and ion-implanting first conductivity-type impurities to form an LDD diffusion layer which is a medium concentration diffusion layer.

DESCRIPTION OF THE EMBODIMENTS

By using the above-described means, it is possible to achieve enhancement of a breakdown voltage by alleviating an electric field in the vicinity of a gate electrode and to realize high ESD resistance by lowering resistance due to an increase in concentration in the vicinity of a drain diffusion layer.

In addition, a drain LDD diffusion layer is provided by separating a high-concentration diffusion layer from a gate electrode, and thus it is possible to suppress a variation in the high-concentration diffusion layer and easily adjust a breakdown voltage by the drain LDD diffusion layer.

Hereinafter, embodiments will be described using the drawings. In addition, hereinafter, in a case that the term "drain" alone is used, it will be understood to indicate a structure including a drain diffusion layer and constituted by an impurity layer of the same conductivity type as that of the drain diffusion layer, and in a case that the term "source" alone is used, it will be understood to indicate a structure including a source diffusion layer and constituted by an impurity layer of the same conductivity type as that of the source diffusion layer.

First Embodiment

Figure 1:
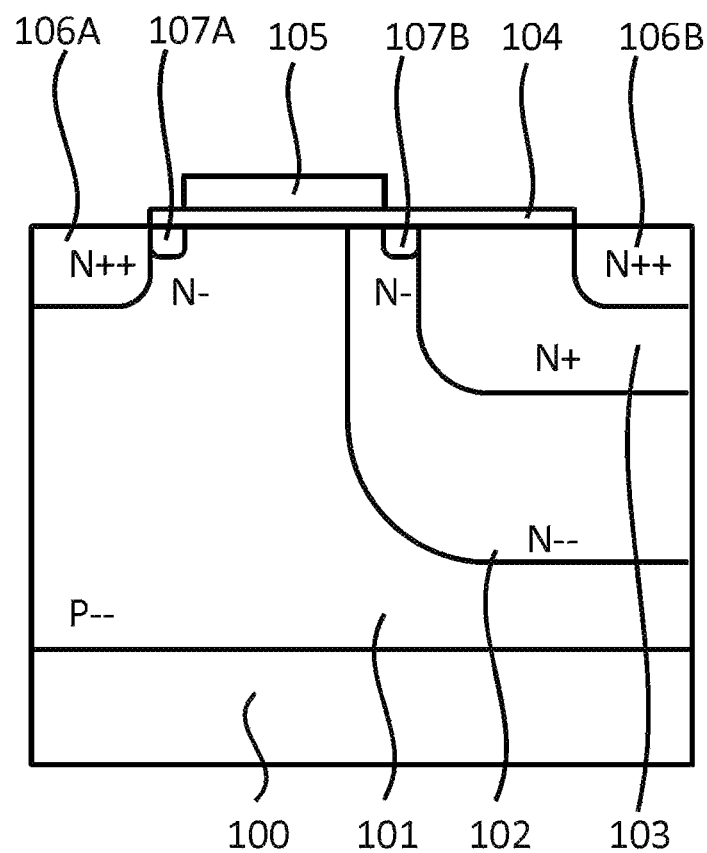
FIG. 1 is a schematic cross-sectional view illustrating an N-type MOS transistor of a semiconductor device according to a first embodiment of the present invention.

FIG. 1 is a schematic cross-sectional view illustrating an N-type MOS transistor 10 of a semiconductor device according to a first embodiment of the present invention.

The N-type MOS transistor 10 includes a semiconductor substrate 100, a second conductivity type (a P-type in the present embodiment) low-concentration diffusion layer 101 disposed inwardly from the surface of the semiconductor substrate 100, a gate electrode 105 disposed on the surface of the semiconductor substrate 100 with an interposition of a gate oxide film 104, a first conductivity type (an N-type in the present embodiment) source diffusion layer 106A disposed on a surface of the semiconductor substrate 100 which is positioned on one side of the gate electrode 105, a first conductivity-type drain diffusion layer 106B disposed on the surface of the semiconductor substrate 100 which is positioned on the other side of the gate electrode 105 to be separated from the gate electrode 105, a first conductivity-type drain LDD diffusion layer 107B disposed between a portion directly under an end on the drain diffusion layer 106B side which is an end of the gate electrode 105 and the drain diffusion layer 106B, a first conductivity-type high concentration diffusion layer 103 provided to include the drain diffusion layer 106B from a position closer to a drain side than an end on a source side of the drain LDD diffusion layer 107B with respect to the gate electrode 105 and provided from the surface of the semiconductor substrate 100 to a position deeper than the bottom of the drain diffusion layer 106B in a vertical direction, and a first conductivity-type low concentration diffusion layer 102 provided to include the drain LDD diffusion layer 107B, the high-concentration diffusion layer 103, and the drain diffusion layer 106B from the surface of the semiconductor substrate 100 below the gate electrode 105. The concentration of impurities of the drain LDD diffusion layer 107B is higher than the concentration of impurities of the first conductivity-type low concentration diffusion layer 102 and is lower than the concentration of impurities of the first conductivity-type high concentration diffusion layer 103, and thus the concentration of impurities of the drain LDD diffusion layer 107B can also be said to be medium.

Further, in the N-type MOS transistor 10, a source LDD diffusion layer 107A is disposed between a portion directly under an end on the source diffusion layer side which is the other end of the gate electrode 105 and the source diffusion layer 106A. Thus, the source diffusion layer 106A is disposed to be separate from the other end of the gate electrode 105. A channel is induced in a region which is located between the source LDD diffusion layer 107A and the drain LDD diffusion layer 107B and which is located in the vicinity of the surface of the semiconductor substrate of the second conductivity-type low concentration diffusion layer 101 below the gate electrode 105. Meanwhile, the source LDD diffusion layer 107A which is in contact with the source diffusion layer 106A may not be disposed, and this case will be described later as a modification example.

In a case where the semiconductor substrate 100 and the low-concentration diffusion layer 101 have the same conductivity type, they can be regarded as one body. That is, the semiconductor substrate 100 itself may be regarded as the low-concentration diffusion layer 101.

Signs of N−−, N−, N+, N++, P−−, P−, P+, and P++ used in the drawings indicate relative degrees of concentration of impurities diffused into a certain region. That is, the concentration of N-type impurities increases in the order of N−−, N−, N+, and N++, and the concentration of P-type impurities increases in the order of P−−, P−, P+, and P++.

By adopting the above-described structure, since a step-wise concentration gradient can be given to the region from the channel to the drain diffusion layer, it is possible to make the concentration of impurities in the vicinity of the channel lower than that in the related art and to make the concentration of impurities in the vicinity of the drain diffusion layer higher than that in the related art. High ESD resistance can thus be realized by alleviating an electric field in the vicinity of the channel to enhance the breakdown voltage, suppressing deterioration due to hot carriers, and lowering resistance in the vicinity of the drain diffusion layer.

Next, a method of manufacturing the N-type MOS transistor 10 illustrated in FIG. 1 will be described. FIGS. 2 to 7 are schematic cross-sectional views illustrating manufacturing steps of manufacturing the N-type MOS transistor 10.

Figure 2:
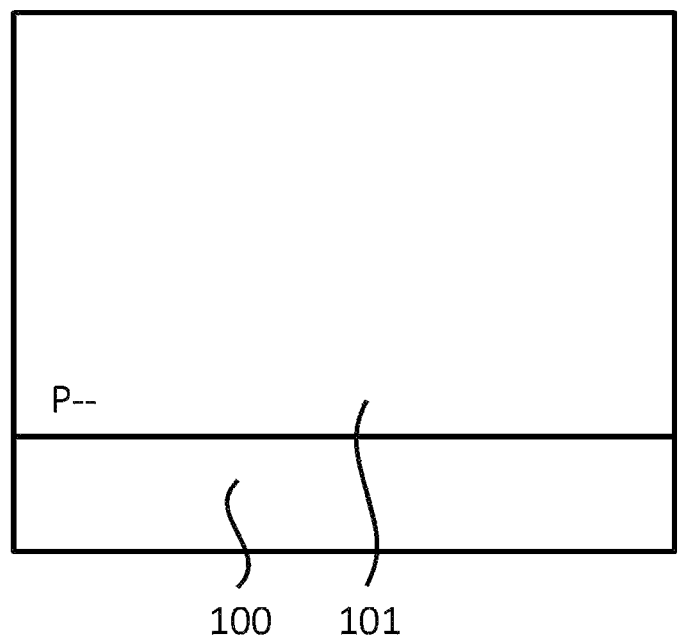
FIG. 2 is a schematic cross-sectional view illustrating a semiconductor device manufacturing process according to the first embodiment.

First, as illustrated in FIG. 2, P-type impurities are ion-implanted into the semiconductor substrate 100 to form a P-type region 101. The P-type region 101 can also be formed by epitaxial growth.

Figure 3:
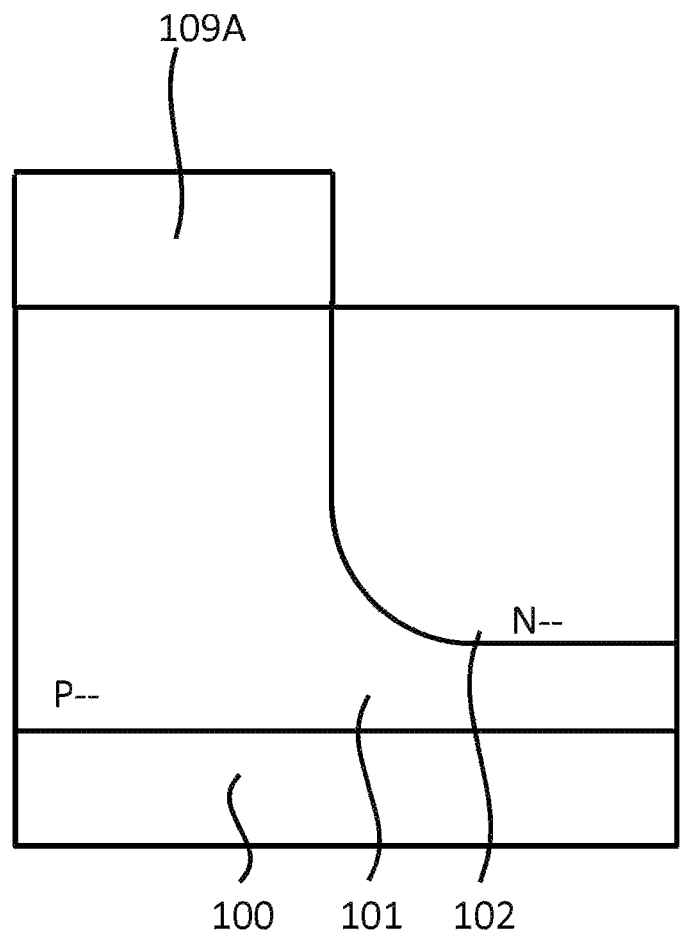
FIG. 3 is a schematic cross-sectional view illustrating the semiconductor device manufacturing process according to the first embodiment.

Subsequently, as illustrated in FIG. 3, a resist film 109A is arranged, and N-type impurities are ion-implanted using the resist film 109A as a mask, thereby forming the N-type low concentration diffusion layer 102 by thermal diffusion after the resist film 109A is peeled off.

Figure 4:
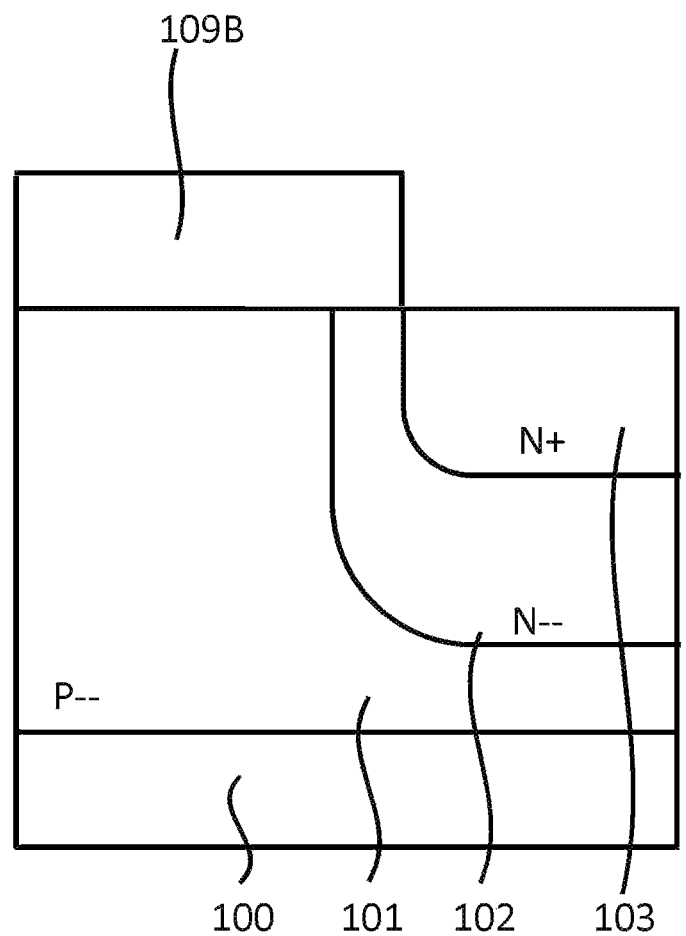
FIG. 4 is a schematic cross-sectional view illustrating the semiconductor device manufacturing process according to the first embodiment.

Subsequently, as illustrated in FIG. 4, a resist film 109B is arranged such that a region inside the N-type low concentration diffusion layer 102 is opened, and N-type impurities are ion-implanted using the resist film 109B as a mask, thereby forming the N-type high concentration diffusion layer 103.

Since the P-type low concentration diffusion layer 101 and the N-type low concentration diffusion layer 102 are mainly used as wells in many cases, impurities contained in the wells are diffused over a wide range, and concentration is also lowered. On the other hand, the N-type high concentration diffusion layer 103 does not undergo high-temperature long-time thermal treatment for diffusion of wells, and thus it is possible to form a diffusion layer uniformly and with little variation due to thermal treatment. Thereby, as illustrated in FIG. 1, it is possible to greatly change the breakdown voltage of the MOS transistor according to the distance between the N-type high concentration diffusion layer 103 and the channel and the distance from an end of the N-type high concentration diffusion layer 103 to a contact formed in the drain diffusion layer 106B, and thus the use of the N-type high concentration diffusion layer 103 with less structural variation is particularly effective in manufacturing an off-transistor that can be used in a case where a margin of a breakdown voltage against the internal element is small.

Figure 5:
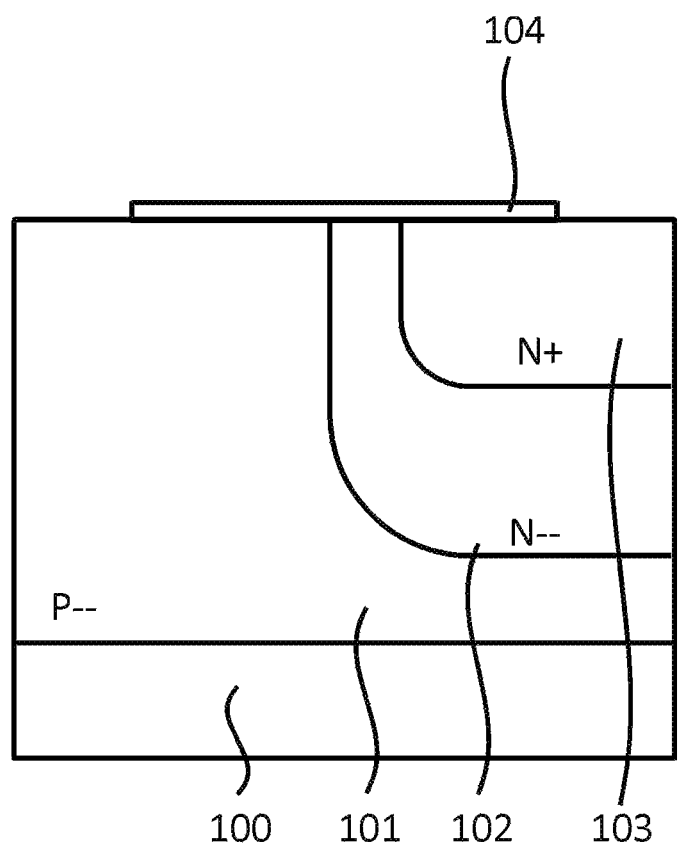
FIG. 5 is a schematic cross-sectional view illustrating the semiconductor device manufacturing process according to the first embodiment.
Figure 6:
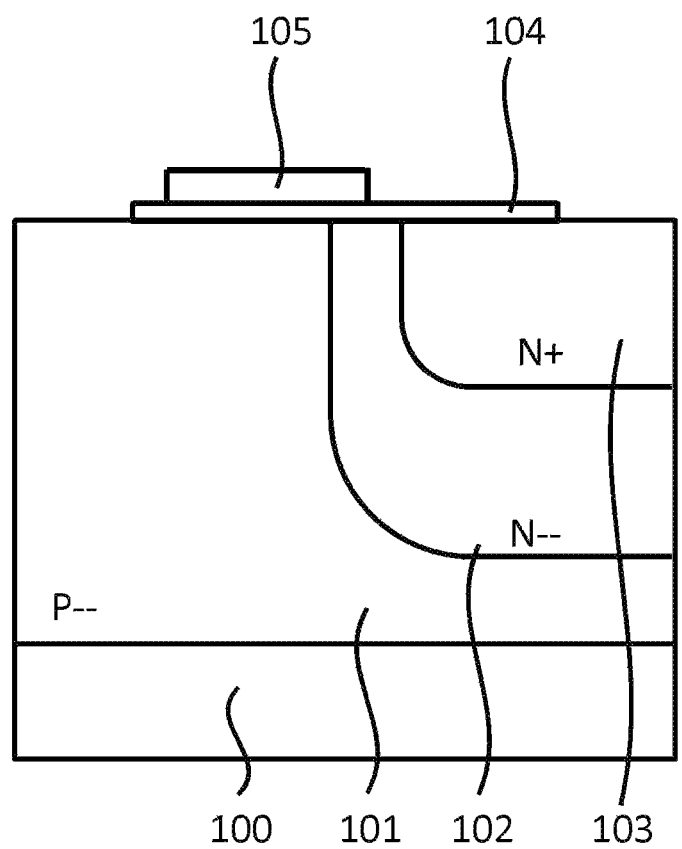
FIG. 6 is a schematic cross-sectional view illustrating the semiconductor device manufacturing process according to the first embodiment.

Subsequently, the gate oxide film 104 is formed as illustrated in FIG. 5, and the gate electrode 105 is then formed as illustrated in FIG. 6. The gate electrode 105 generally contains polycrystalline silicon as a main component.

Figure 7:
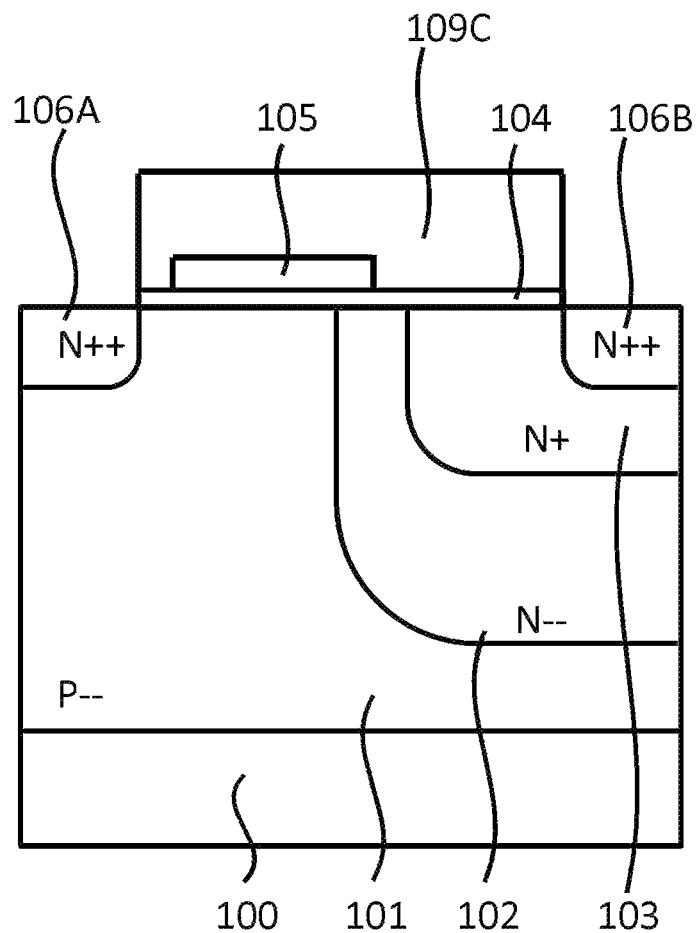
FIG. 7 is a schematic cross-sectional view illustrating the semiconductor device manufacturing process according to the first embodiment.

Subsequently, as illustrated in FIG. 7, the N-type source diffusion layer 106A and the drain diffusion layer 106B are formed by ion-implanting N-type impurities using the resist film 109C of which a necessary portion is opened.

Then, referring back to FIG. 1, an N-type source LDD diffusion layer 107A and a drain LDD diffusion layer 107B are formed by ion-implanting N-type impurities using the gate electrode 105 as a mask as illustrated in FIG. 1. The source LDD diffusion layer 107A and the drain LDD diffusion layer 107B may be formed continuously from both ends of the gate electrode 105 to the surfaces of the source diffusion layer 106A and the drain diffusion layer 106B. This is because the concentration of impurities of each of the source LDD diffusion layer 107A and the drain LDD diffusion layer 107B is higher than the concentration of impurities of the N-type low concentration diffusion layer 102, but is lower than the concentration of impurities of each of the N-type high concentration diffusion layer 103, the N-type source diffusion layer 106A, and the drain diffusion layer 106B. The formation of the N-type source LDD diffusion layer 107A and the drain LDD diffusion layer 107B is a stage close to the end of a wafer manufacturing process, and thus thermal treatment to be applied is small and variations in characteristics caused by thermal diffusion are small. For this reason, it is possible to easily adjust an element breakdown voltage with the concentration of impurities of both the layers.

Although not illustrated in the drawings, the manufacture of the semiconductor device is completed by forming a contact to penetrate an insulating interlayer provided on the gate electrode 105, the source diffusion layer 106A, and the drain diffusion layer 106B, and forming a metal wiring and a passivation film.

Figure 8:
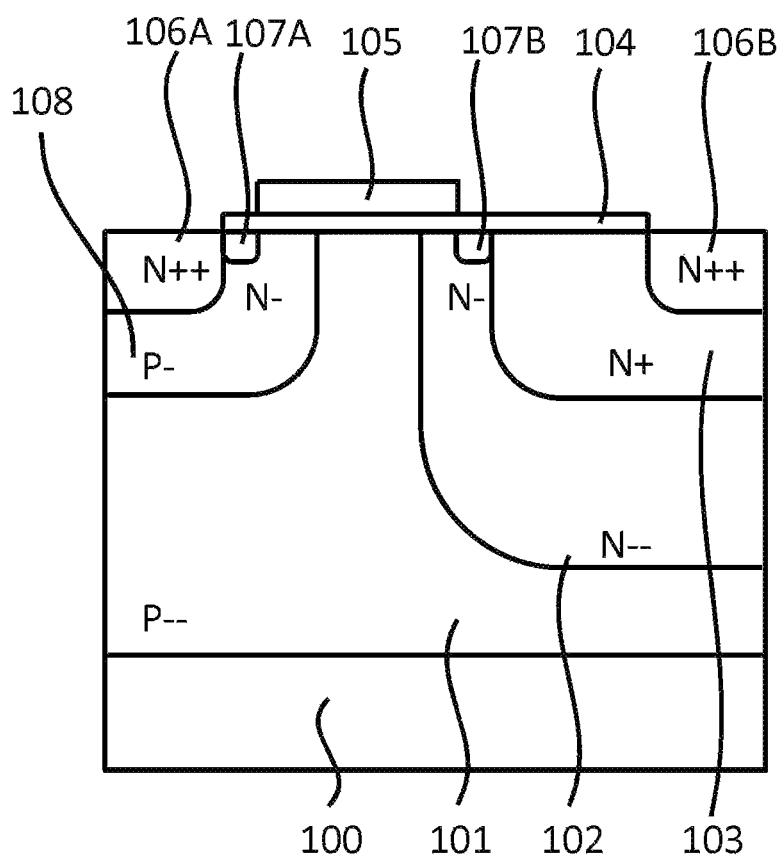
FIG. 8 is a schematic cross-sectional view illustrating a first modification example of the N-type MOS transistor of the semiconductor device according to the first embodiment of the present invention.

FIG. 8 is a schematic cross-sectional view illustrating an N-type MOS transistor 20 which is a first modification example of the N-type MOS transistor 10 of the semiconductor device according to the first embodiment of the present invention. The N-type MOS transistor 20 is different from the N-type MOS transistor 10 in that a P-type medium concentration region 108 extending to a channel under the gate electrode 105 is provided to cover the source diffusion layer 106A and the source LDD diffusion layer 107A.

The concentration of impurities of a P-type region in contact with the source diffusion layer 106A and the source LDD diffusion layer 107A is made higher than that of the P-type low concentration diffusion layer 101 by providing the P-type medium concentration region 108, and thus it is possible to reduce a leakage current flowing into the source diffusion layer 106A and the source LDD diffusion layer 107A. Further, the P-type medium concentration region 108 is provided on merely a source side, and thus the distribution of impurities on a drain side does not change. For this reason, the N-type MOS transistor 20 can hold the same ESD breakdown voltage as that of the N-type MOS transistor 10 according to the first embodiment.

Figure 9:
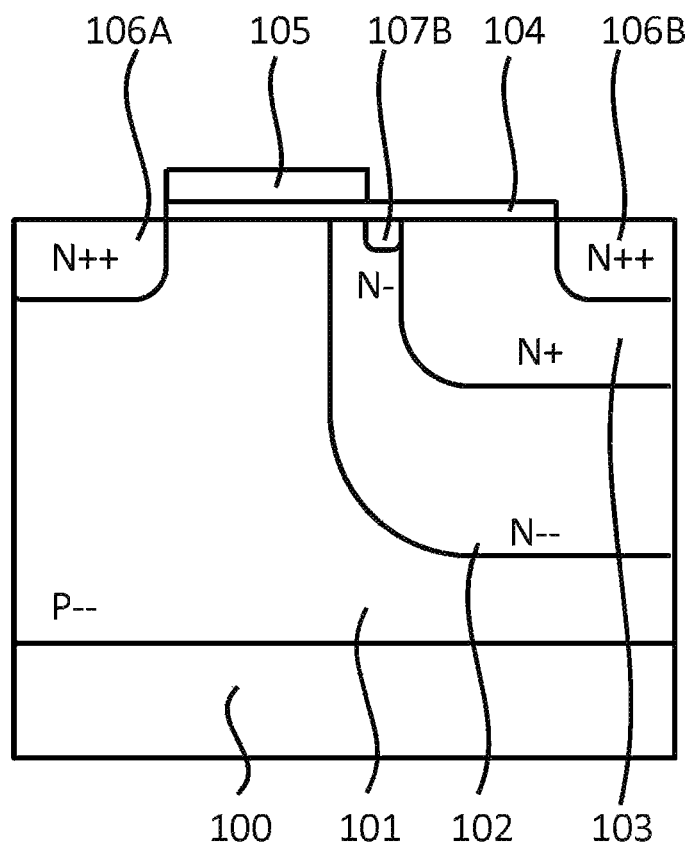
FIG. 9 is a schematic cross-sectional view illustrating a second modification example of the N-type MOS transistor of the semiconductor device according to the first embodiment of the present invention.

FIG. 9 is a schematic cross-sectional view illustrating an N-type MOS transistor 30 which is a second modification example of the N-type MOS transistor 10 of the semiconductor device according to the first embodiment of the present invention. The source LDD diffusion layer 107A provided in a region extending from the source diffusion layer 106A to a portion directly under the gate electrode 105 in the N-type MOS transistor 10 is not provided in the N-type MOS transistor 30. Further, the source diffusion layer 106A is provided in contact with a portion directly under an end of the gate electrode 105. In a case where an electric field intensity does not increase significantly in the vicinity of the source diffusion layer 106A, the source LDD diffusion layer 107A can be omitted in this manner, and the source diffusion layer 106A can be disposed directly under the end of the gate electrode 105. The size of the N-type MOS transistor 30 can, accordingly, be reduced in a direction along the channel.

Figure 10:
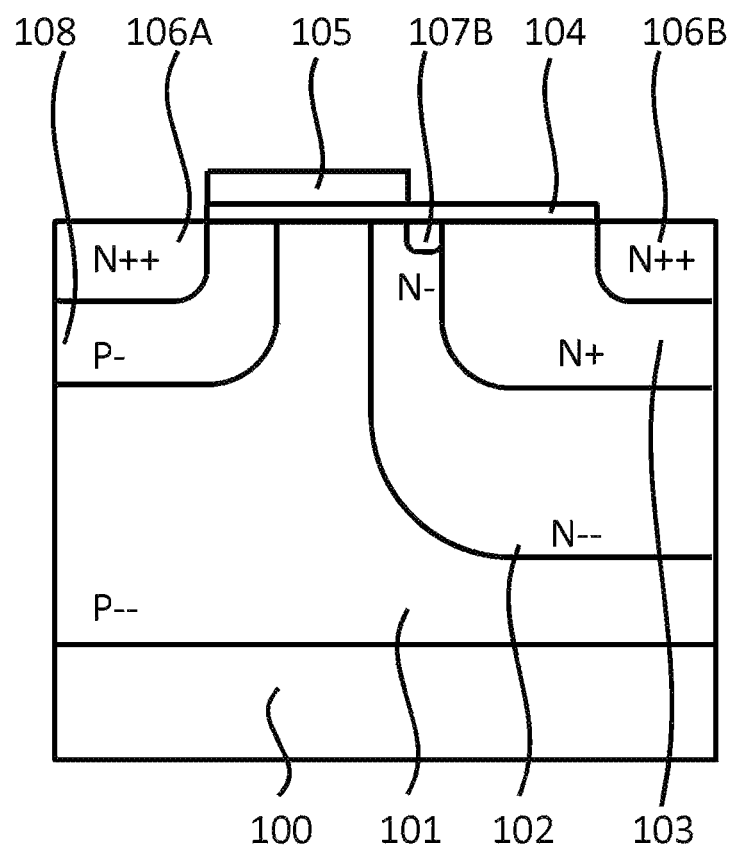
FIG. 10 is a schematic cross-sectional view illustrating a third modification example of the N-type MOS transistor of the semiconductor device according to the first embodiment of the present invention.

FIG. 10 is a schematic cross-sectional view illustrating an N-type MOS transistor 40 which is a third modification example of the N-type MOS transistor 10 of the semiconductor device according to the first embodiment of the present invention. The N-type MOS transistor 40 is different from the N-type MOS transistor 10 in that there is no source LDD diffusion layer 107A provided in a region extending from the source diffusion layer 106A to a portion directly under the gate electrode 105, and the P-type medium concentration region 108 extending to the channel below the gate electrode 105 is provided to cover the source diffusion layer 106A.

In the N-type MOS transistor 40, the P-type medium concentration region 108 is provided, and thus it is possible to reduce a leakage current flowing into the source diffusion layer 106A, similar to the N-type MOS transistor 20 which is the first modification example. Further, the source LDD diffusion layer 107A is not provided, and thus it is possible to dispose the source diffusion layer 106A directly under the end of the gate electrode 105 and reduce the size of the N-type MOS transistor 40 in a direction along the channel.

Second Embodiment

Figure 11:
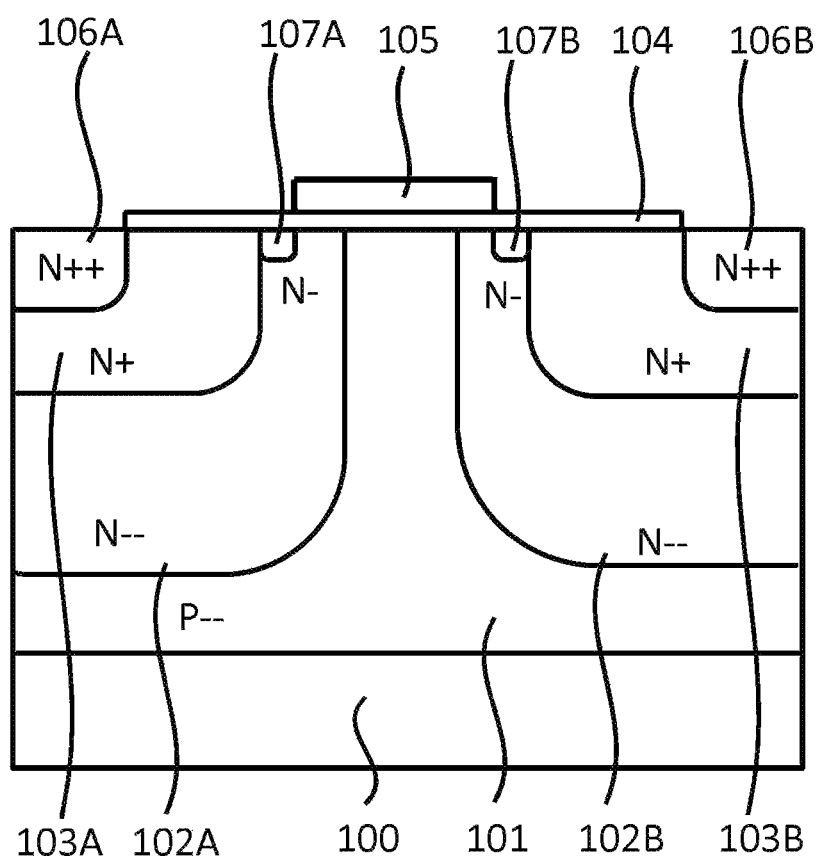
FIG. 11 is a schematic cross-sectional view illustrating an N-type MOS transistor of a semiconductor device according to a second embodiment of the present invention.

FIG. 11 is a schematic cross-sectional view illustrating an N-type MOS transistor 50 of a semiconductor device according to a second embodiment of the present invention.

In the N-type MOS transistor 50, the structure of a drain and a source are the same and symmetrical to each other. That is, in the N-type MOS transistor 10 according to the first embodiment, the structures of the source and the drain are not the same and are asymmetrical to each other, but the N-type MOS transistor 50 is configured by making the structure of a source surrounding a source diffusion layer 106A the same as the structure of a drain.

Specifically, the N-type MOS transistor 50 includes a semiconductor substrate 100, a second conductivity type (a P-type in the present embodiment) low-concentration diffusion layer 101 disposed inwardly from the surface of the semiconductor substrate 100, a gate electrode 105 disposed on the surface of the semiconductor substrate 100 with an interposition of a gate oxide film 104, a first conductivity type (an N-type in the present embodiment) source diffusion layer 106A disposed on a surface of the semiconductor substrate 100 which is positioned on one side of the gate electrode 105 to be separated from the gate electrode 105, a first conductivity-type drain diffusion layer 106B disposed on the surface of the semiconductor substrate 100 which is positioned on the other side of the gate electrode 105 to be separated from the gate electrode 105, a first conductivity-type drain LDD diffusion layer 107B disposed between a portion directly under an end on the drain diffusion layer 106B side which is an end of the gate electrode 105 and the drain diffusion layer 106B, a first conductivity-type source LDD diffusion layer 107A disposed between a portion directly under an end on the source diffusion layer 106A side which is the other end of the gate electrode 105 and the source diffusion layer 106A, a first conductivity-type high concentration diffusion layer 103B provided from a position closer to a drain side than the drain LDD diffusion layer 107B with respect to the gate electrode 105 to the drain diffusion layer 106B and provided from the surface of the semiconductor substrate 100 to a position deeper than the bottom of the drain diffusion layer 106B in a vertical direction, a first conductivity-type high concentration diffusion layer 103A provided from a position closer to a source side than the source LDD diffusion layer 107A with respect to the gate electrode 105 to the source diffusion layer 106A and provided from the surface of the semiconductor substrate 100 to a position deeper than the bottom of the source diffusion layer 106A in a vertical direction, a first conductivity-type low concentration diffusion layer 102B provided to include the drain LDD diffusion layer 107B, the high-concentration diffusion layer 103B, and the drain diffusion layer 106B from the surface of the semiconductor substrate 100 below the gate electrode 105, and a first conductivity-type low concentration diffusion layer 102A provided to include the source LDD diffusion layer 107A, the high-concentration diffusion layer 103A, and the source diffusion layer 106A from the surface of the semiconductor substrate 100 below the gate electrode 105.

In the N-type MOS transistor 50, the structures of a drain and a source are the same and symmetrical to each other, and thus the role of the source and the drain can be switched.

Third Embodiment

Figure 12:
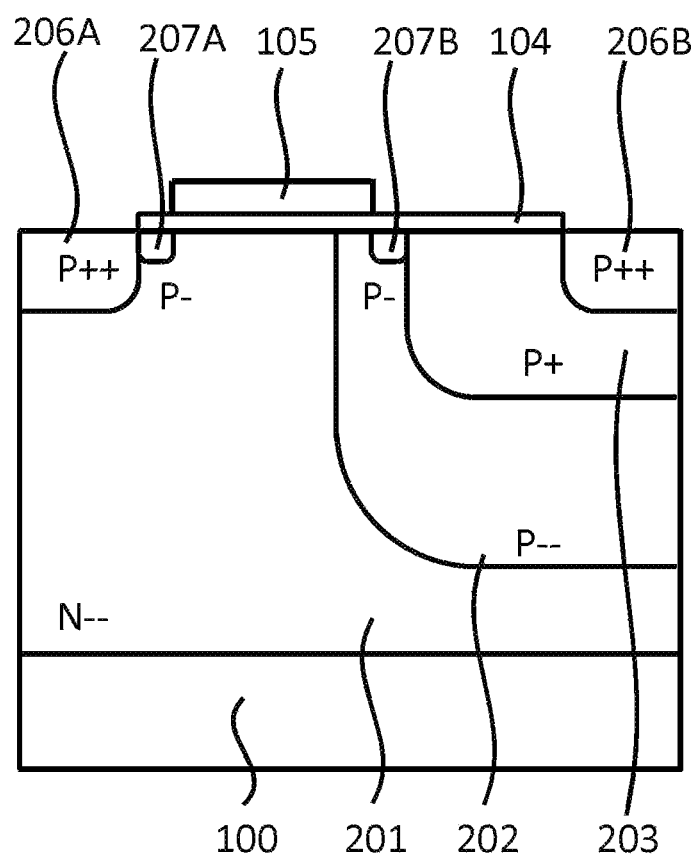
FIG. 12 is a schematic cross-sectional view illustrating a P-type MOS transistor of a semiconductor device according to a third embodiment of the present invention.

FIG. 12 is a schematic cross-sectional view illustrating a P-type MOS transistor 60 of a semiconductor device according to a third embodiment of the present invention. In the P-type MOS transistor 60, conductivity types in all regions in the N-type MOS transistor 10 according to the first embodiment are switched to opposite conductivity types. That is, in the N-type MOS transistor 10, a P-type region is switched to an N-type region, and an N-type region is switched to a P-type region, then we can obtain the P-type MOS transistor 60.

The P-type MOS transistor 60 includes a semiconductor substrate 100, a second conductivity type (an N-type in the present embodiment) low-concentration diffusion layer 201 disposed inwardly from the surface of the semiconductor substrate 100, a gate electrode 105 disposed on the surface of the semiconductor substrate 100 with an interposition of a gate oxide film 104, a first conductivity type (a P-type in the present embodiment) source diffusion layer 206A disposed on a surface of the semiconductor substrate 100 which is positioned on one side of the gate electrode 105, a first conductivity-type drain diffusion layer 206B disposed on the surface of the semiconductor substrate 100 which is positioned on the other side of the gate electrode 105 to be separated from the gate electrode 105, a first conductivity-type drain LDD diffusion layer 207B disposed between a portion directly under an end on the drain diffusion layer 206B side which is an end of the gate electrode 105 and the drain diffusion layer 206B, a first conductivity-type high concentration diffusion layer 203 provided from a position closer to a drain side than the drain LDD diffusion layer 207B with respect to the gate electrode 105 to the drain diffusion layer 206B and provided from the surface of the semiconductor substrate 100 to a position deeper than the bottom of the drain diffusion layer 206B in a vertical direction, and a first conductivity-type low concentration diffusion layer 202 provided to include the drain LDD diffusion layer 207B, the high-concentration diffusion layer 203, and the drain diffusion layer 206B from the surface of the semiconductor substrate 100 below the gate electrode 105. Further, a source LDD diffusion layer 207A is disposed between a portion directly under an end on the source diffusion layer side which is the other end of the gate electrode 105 and the source diffusion layer 206A.

The P-type MOS transistor 60 can be easily used in combination with the N-type MOS transistor 10 or the like using a high side of the power supply voltage, such as VDD, as a voltage applied to a source.

Figure 13:
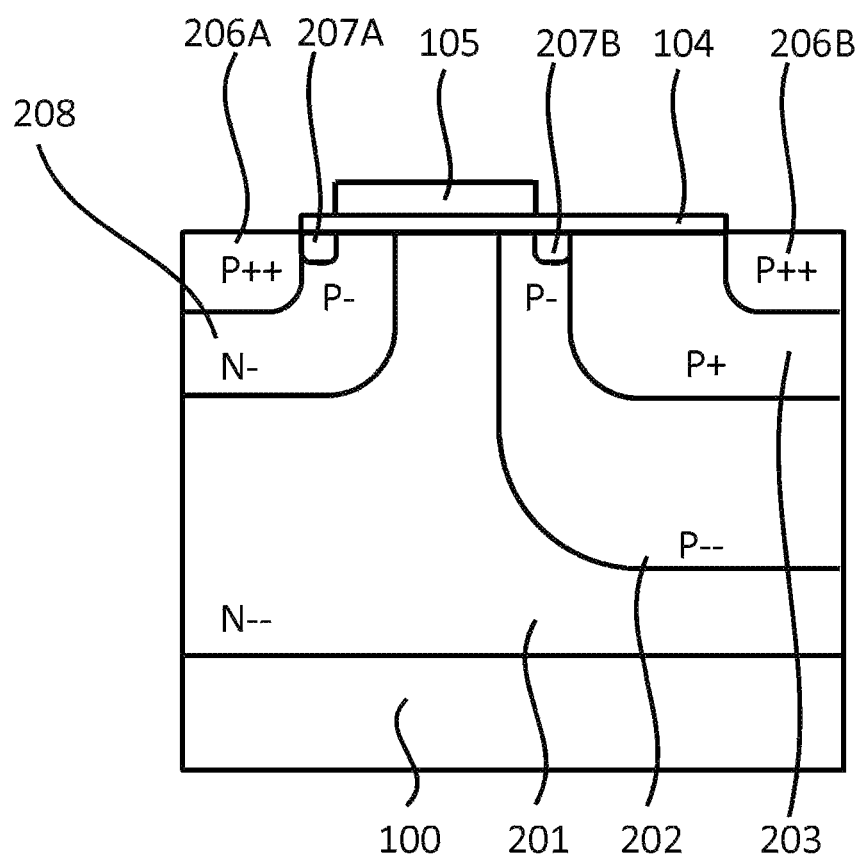
FIG. 13 is a schematic cross-sectional view illustrating a modification example of the P-type MOS transistor of the semiconductor device according to the third embodiment of the present invention.

FIG. 13 is a schematic cross-sectional view illustrating a P-type MOS transistor 70 which is a modification example of the P-type MOS transistor 60 of the semiconductor device according to the third embodiment of the present invention. The P-type MOS transistor 70 is different from the P-type MOS transistor 60 in that a N-type medium concentration region 208 extending to the channel below the gate electrode 105 is further provided to cover the source diffusion layer 206A and the source LDD diffusion layer 207A.

Features of the P-type MOS transistor 70 with respect to the P-type MOS transistor 60 illustrated in FIG. 12 are the same as features of the N-type MOS transistor 20 with respect to the N-type MOS transistor 10 illustrated in FIG. 1, and it is possible to reduce a leakage current while holding an ESD breakdown voltage.

Fourth Embodiment

Figure 14:
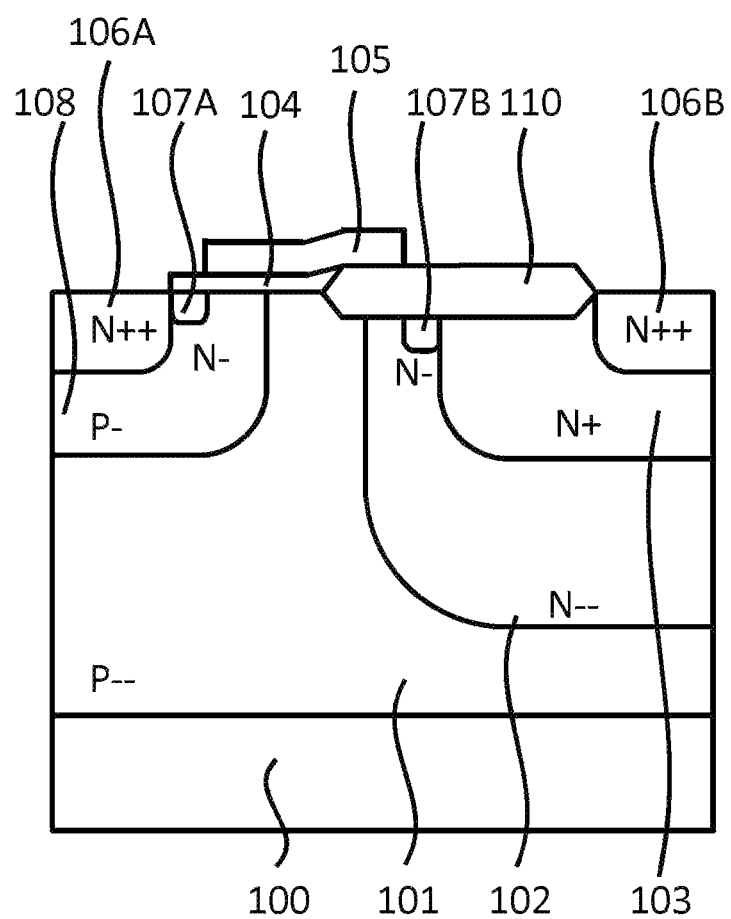
FIG. 14 is a schematic cross-sectional view illustrating an N-type MOS transistor according to a fourth embodiment of the present invention.

FIG. 14 is a schematic cross-sectional view illustrating an N-type MOS transistor 80 of a semiconductor device according to a fourth embodiment of the present invention.

The N-type MOS transistor 80 is different from the N-type MOS transistor 20 described as the first modification example of the first embodiment in that a field oxide film 110 thicker than a gate oxide film 104 is provided on the surface of a semiconductor substrate 100 extending from the middle of a channel to a drain diffusion layer 106B. On the other hand, a first conductivity-type (here, an N-type) source LDD diffusion layer 107A and a second conductivity type (here, a P-type) medium concentration region 108 which are provided in the vicinity of a first conductivity type source diffusion layer 106A, and a first conductivity-type low concentration diffusion layer 102, a first conductivity-type high concentration diffusion layer 103, and a first conduc-tivity-type drain LDD diffusion layer 107B which are provided in the vicinity of the drain diffusion layer 106B are substantially the same.

A gate electrode 105 is provided to extend not only on the gate oxide film 104 but also on the field oxide film 110. Thereby, an end of the gate electrode 105 on a drain diffusion layer side and an end of the drain LDD diffusion layer 107B on a source diffusion layer side do not need to be in contact with each other in a plan view from a direction perpendicular to the surface of the semiconductor substrate. In addition, regarding the first conductivity-type low concentration diffusion layer 102, a boundary surface on a source diffusion layer side on the surface of the semiconductor substrate may be positioned below the field oxide film 110 or may be positioned below the gate oxide film 104.

In the structure of the N-type MOS transistor 80, the field oxide film 110 is present between the gate electrode 105 and a plurality of first conductivity-type diffusion layers provided in the vicinity of the drain diffusion layer 106B, and thus it is possible to improve a breakdown voltage between the gate and the drain, and particularly to improve the breakdown voltage in turn-off period of the N-type MOS transistor 80.

Although the N-type MOS transistor 80 includes the source LDD diffusion layer 107A and the second conductivity-type medium concentration region 108, a structure which does not include either one or both of them can be easily implemented as described in the first embodiment.

In addition, it is also easy to configure a P-type MOS transistor in which all conductivity types of diffusion layers containing impurities are switched with respect to the N-type MOS transistor 80.

It will be apparent to those skilled in the art that various modifications and variations can be made to the disclosed embodiments without departing from the scope or spirit of the present invention. In view of the foregoing, it is intended that the present invention covers modifications and variations provided that they fall within the scope of the following claims and their equivalents.

What is claimed is:
1. A semiconductor device comprising:
a semiconductor substrate;
a second conductivity-type low concentration diffusion layer provided on the semiconductor substrate;
a gate electrode provided on a surface of the second conductivity-type low concentration diffusion layer with an interposition of a gate oxide film;
a first conductivity-type source diffusion layer provided on a surface of the semiconductor substrate which is positioned on one side of the gate electrode, and a first conductivity-type drain diffusion layer provided on the surface of the semiconductor substrate which is positioned on the other side of the gate electrode to be separated from the gate electrode;
a first conductivity-type drain LDD diffusion layer provided on the surface of the semiconductor substrate between the drain diffusion layer and a portion directly under an end of the gate electrode on the drain diffusion layer side, wherein the first conductivity-type drain LDD diffusion layer is provided in contact with the portion directly under the end of the gate electrode on the drain diffusion layer side;
a first conductivity-type high concentration diffusion layer provided to include the drain diffusion layer from a position closer to the drain diffusion layer than an end of the drain LDD diffusion layer on the source diffusion layer side and having a concentration of impurities higher than that of the drain LDD diffusion layer and lower than that of the drain diffusion layer; and a first conductivity-type low concentration diffusion layer provided to include the drain LDD diffusion layer, the high-concentration diffusion layer, and the drain diffusion layer from the surface of the semiconductor substrate below the gate electrode and having a concentration of impurities lower than that of the drain LDD diffusion layer.

2. The semiconductor device according to claim 1, further comprising:
a second conductivity-type medium concentration region covering the source diffusion layer and extending to a channel below the gate electrode.

3. The semiconductor device according to claim 1, further comprising:
a first conductivity-type source LDD diffusion layer provided on the surface of the semiconductor substrate between the source diffusion layer and a channel.

4. The semiconductor device according to claim 3, further comprising:
a second conductivity-type medium concentration region covering the source diffusion layer and the source LDD diffusion layer and extending to a channel below the gate electrode.

5. A semiconductor device comprising:
a semiconductor substrate;
a second conductivity-type low concentration diffusion layer provided inwardly from a surface of the semiconductor substrate;
a first conductivity-type source diffusion layer and a first conductivity-type drain diffusion layer provided on a surface of the semiconductor substrate on an inner side of the second conductivity-type low concentration diffusion layer with an interval;
a field oxide film provided from a position between the source diffusion layer and the drain diffusion layer to an end of the drain diffusion layer;
a gate oxide film provided from an end of the field oxide film on the source side to an end of the source diffusion layer on a surface of the second conductivity-type low concentration diffusion layer;
a gate electrode provided to cover portions of the gate oxide film and the field oxide film;
a first conductivity-type drain LDD diffusion layer provided on the surface of the semiconductor substrate below the field oxide film, wherein the first conductivity-type drain LDD diffusion layer is provided in contact with a portion directly under an end of the gate electrode on the drain diffusion layer side;
a first conductivity-type high concentration diffusion layer provided to include the drain diffusion layer from a position closer to the drain diffusion layer than an end of the drain LDD diffusion layer on the source diffusion layer side and having a concentration of impurities higher than that of the drain LDD diffusion layer and lower than that of the drain diffusion layer; and
a first conductivity-type low concentration diffusion layer provided to include the drain LDD diffusion layer, the high-concentration diffusion layer, and the drain diffusion layer from the surface of the semiconductor substrate below the gate electrode and having a concentration of impurities lower than that of the drain LDD diffusion layer.

6. The semiconductor device according to claim 5, further comprising:
a second conductivity-type medium concentration region covering the source diffusion layer and extending to a channel below the gate electrode.

7. The semiconductor device according to claim 5, further comprising:
a first conductivity-type source LDD diffusion layer provided on the surface of the semiconductor substrate between the source diffusion layer and a channel.

8. The semiconductor device according to claim 7, further comprising:
a second conductivity-type medium concentration region covering the source diffusion layer and the source LDD diffusion layer and extending to the channel below the gate electrode.

9. A semiconductor device manufacturing method comprising:
ion-implanting second conductivity-type impurities on a semiconductor substrate;
ion-implanting first conductivity-type impurities to form a low-concentration diffusion layer by thermal diffusion;
ion-implanting first conductivity-type impurities to form a high-concentration diffusion layer;
forming a gate oxide film;
forming a gate electrode;
ion-implanting first conductivity-type impurities to form a source diffusion layer and a drain diffusion layer; and
ion-implanting first conductivity-type impurities to form an LDD diffusion layer which is a medium concentration diffusion layer,
wherein the source diffusion layer is provided on a surface of the semiconductor substrate which is positioned on one side of the gate electrode, and the drain diffusion layer is provided on the surface of the semiconductor substrate which is positioned on the other side of the gate electrode to be separated from the gate electrode,
the LDD diffusion layer is provided on the surface of the semiconductor substrate between the drain diffusion layer and a portion directly under an end of the gate electrode on the drain diffusion layer side, wherein the drain LDD diffusion layer is provided in contact with the portion directly under the end of the gate electrode on the drain diffusion layer side,
the high-concentration diffusion layer is provided to include the drain diffusion layer from a position closer to the drain diffusion layer than an end of the drain LDD diffusion layer on the source diffusion layer side and has a concentration of impurities higher than that of the drain LDD diffusion layer and lower than that of the drain diffusion layer, and
the low-concentration diffusion layer is provided to include the drain LDD diffusion layer, the high-concentration diffusion layer, and the drain diffusion layer from the surface of the semiconductor substrate below the gate electrode and has a concentration of impurities lower than that of the drain LDD diffusion layer.

* * * * *